(12) United States Patent
Chandra et al.

(10) Patent No.: US 9,214,204 B2
(45) Date of Patent: Dec. 15, 2015

(54) WORDLINE PULSE DURATION ADAPTATION IN A DATA STORAGE APPARATUS

(71) Applicant: ARM LIMITED, Cambridge (GB)

(72) Inventors: Vikas Chandra, Fremont, CA (US); Peter Beshay, Charlottesville, VA (US)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 14/219,498

(22) Filed: Mar. 19, 2014

(65) Prior Publication Data

US 2015/0269982 A1    Sep. 24, 2015

(51) Int. Cl.
  *G11C 7/00*   (2006.01)
  *G11C 7/22*   (2006.01)
  *G11C 29/12*  (2006.01)

(52) U.S. Cl.
  CPC  *G11C 7/22* (2013.01); *G11C 29/12* (2013.01); *G11C 2029/1202* (2013.01)

(58) Field of Classification Search
  CPC ............... G11C 2207/2245; G11C 2207/2281; G11C 7/06; G11C 7/1018; G11C 7/1051; G11C 7/106; G11C 7/1078; G11C 7/1087; G11C 7/12; G11C 7/22; G11C 13/025; G11C 17/14; G11C 17/143; G11C 17/16; G11C 17/165; G11C 17/18; G11C 2213/19
  USPC ......... 365/203, 233.1, 233.11, 148, 156, 176, 365/190, 194, 230.06
  See application file for complete search history.

(56) References Cited

U.S. PATENT DOCUMENTS

2012/0075938 A1* 3/2012 Kolar et al. .............. 365/189.14

OTHER PUBLICATIONS

S. Lee et al, "A 1 GHz ADPLL With a 1.25 ps Minimum-Resolution Sub-Exponent TDC in 0.18 µm CMOS" *IEEE Journal of Solid-State Circuits*, vol. 45, No. 12, Dec. 2010, pp. 2874-2881.
Dong, Wei, Peng Li, and Garng M. Huang. "SRAM dynamic stability: theory, variability and analysis." *Computer-Aided Design, 2008. ICCAD 2008. IEEE/ACM International Conference on*. IEEE, 2008, 8 pages.
Nalam, Satyanand, et al. "Dynamic write limited minimum operating voltage for nanoscale SRAMs." *Design, Automation & Test in Europe Conference & Exhibition (Date)*, 2011. IEEE, 2011, 6 pages.
Bhavnagarwala, Azeez, et al. "Fluctuation limits & scaling opportunities for CMOS SRAM cells." *Electron Devices Meeting, 2005. IEDM Technical Digest. IEEE International*. IEEE, 2005, 4 pages.

(Continued)

*Primary Examiner* — Thong Q Le
(74) *Attorney, Agent, or Firm* — Pramudji Law Group PLLC; Ari Pramudji

(57) ABSTRACT

Apparatus for storing data and a method of adapting a duration of a wordline pulse in an apparatus for storing data are provided. Sensor circuitry comprises a calibrated bitcell which is calibrated to use a duration of wordline pulse which matches a longest wordline pulse required by any bitcell in an array of bitcells for a successful write operation to be carried out. The duration of wordline pulse is signalled to wordline pulse circuitry, which generates a wordline pulse for the array of bitcells with this wordline pulse duration. The sensor circuitry is configured to adapt the wordline pulse duration in dependence on current local conditions in which the apparatus operates to compensate for influence of the current local conditions on the longest wordline pulse required by any bitcell in the array of bitcells.

24 Claims, 13 Drawing Sheets

(56) References Cited

OTHER PUBLICATIONS

Boley, James, et al. "Leveraging sensitivity analysis for fast, accurate estimation of SRAM dynamic write V MIN." *Proceedings of the Conference on Design, Automation and Test in Europe.* EDA Consortium, 2013, 6 pages.

Yamaoka, Masanao, et al. "Low-power embedded SRAM modules with expanded margins for writing." Solid-State Circuits Conference, 2005. Digest of Technical Papers. ISSCC. 2005 IEEE International. IEEE, 2005, 3 pages.

Nho, Hyunwoo, et al. "A 32nm High-k metal gate SRAM with adaptive dynamic stability enhancement for low-voltage operation." *Solid-State Circuits Conference Digest of Technical Papers (ISSCC),* 2010 *IEEE International.* IEEE, 2010, 3 pages.

Carlson, Andrew, et al. "Compensation of systematic variations through optimal biasing of SRAM wordlines." *Custom Integrated Circuits Conference, 2008. CICC 2008. IEEE.* IEEE, 2008, 4 pages.

Joshi, R., et al. "6.6+ GHz Low Vmin, read and half select disturb-free 1.2 Mb SRAM." *VLSI Circuits, 2007 IEEE Symposium on.* IEEE, 2007, 2 pages.

Helal, Belal M., et al. "A low jitter 1.6 GHz multiplying DLL utilizing a scrambling time-todigital converter and digital correlation." VLSI Circuits, 2007 IEEE Symposium on. IEEE, 2007, 2 pages.

Abu-Rahma, Mohamed H., Mohab Anis, and Sei Seung Yoon. "Reducing SRAM power using fine-grained wordline pulsewidth control." Very Large Scale Integration (VLSI) Systems, IEEE Transactions on 18.3 (2010): pp. 356-364.

Staszewski, Robert Bogdan, et al. "1.3 V 20 ps time-to-digital converter for frequency synthesis in 90-nm CMOS." *Circuits and Systems II: Express Briefs, IEEE Transactions on* 53.3 (2006): pp. 220-224.

Lu, Ping, Antonio Liscidini, and Pietro Andreani. "A 3.6 mw, 90 nm cmos gated-vernier timeto-digital converter with an equivalent resolution of 3.2 ps."*Solid-State Circuits, IEEE Journal of* 47.7 (2012): pp. 1626-1635.

M. Straayer and M.H. Perrott. An efficient high-resolution 11-bit noise-shaping multipath gated ring oscillator. VLSI Symp. Dig. Tech. Papers, Jun. 2008, 2 pages.

Chung, Hayun, Hiroki Ishikuro, and Tadahiro Kuroda. "A 10-bit 80-ms/s decision-select successive approximation tdc in 65-nm cmos." *Solid-State Circuits, IEEE Journal of* 47.5 (2012): pp. 1232-1241.

Lee, Seon-Kyoo, et al. "A 1 GHz ADPLL With a 1.25 ps Minimum-Resolution Sub-Exponent TDC in 0.18um CMOS" *Solid-State Circuits, IEEE Journal of* 45.12 (2010): pp. 2874-2881.

Lee, Minjae, and Asad A. Abidi. "A 9 b, 1.25 ps resolution coarse-fine time-to-digital converter in 90 nm CMOS that amplifies a time residue." *Solid-State Circuits, IEEE Journal of* 43.4 (2008): pp. 769-777.

Samarah, Amer, and Anthony Chan Carusone. "A digital phase-locked loop with calibrated coarse and stochastic fine TDC." *Custom Integrated Circuits Conference (CICC), 2012 IEEE.* IEEE, 2012, pp. 1829-1841.

Park, Min, and Michael H. Perrott. "A single-slope 80MS/s ADC using Two-Step Time-to-Digital Conversion." *Circuits and Systems, 2009. ISCAS 2009. IEEE International Symposium on.* IEEE, 2009, 4 pages.

\* cited by examiner

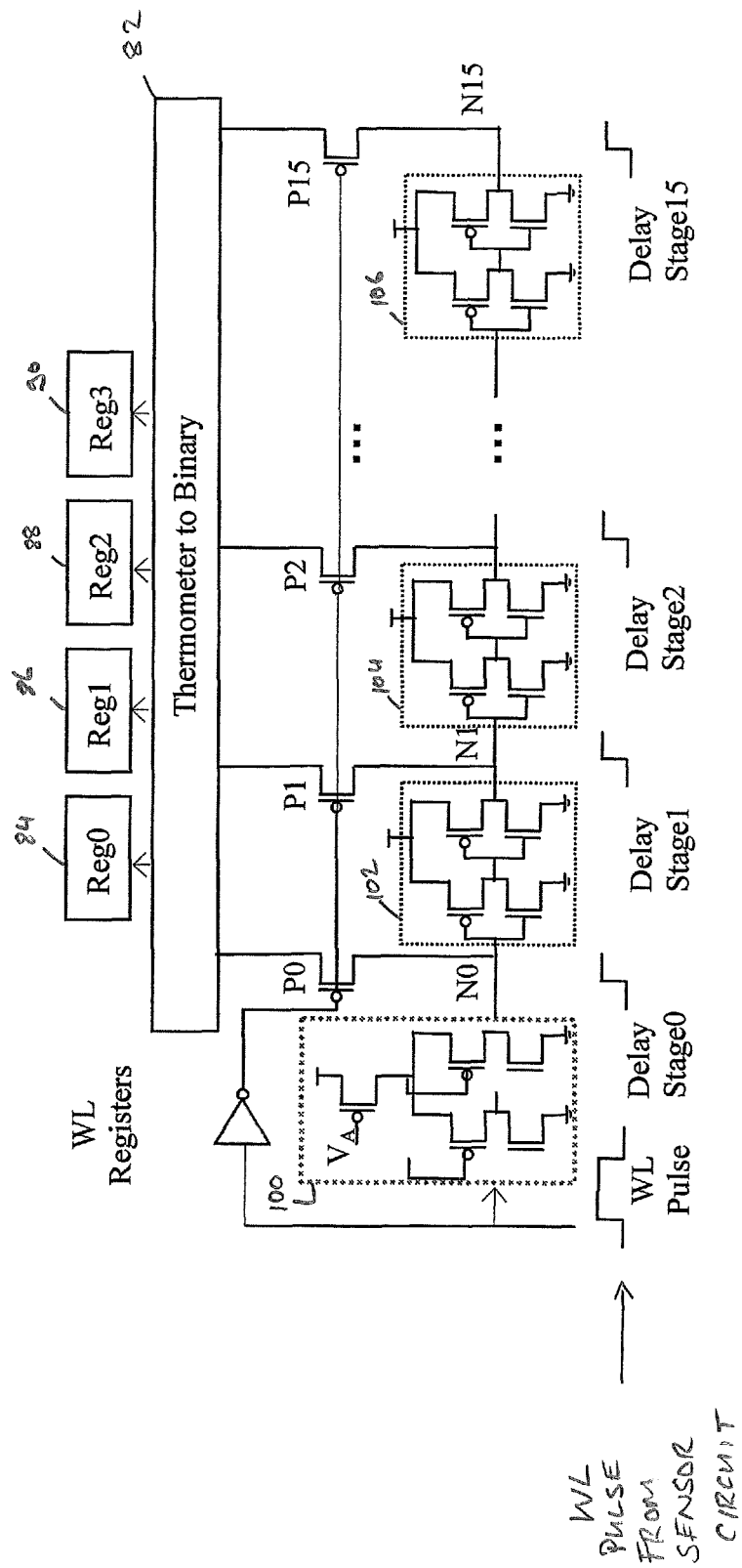

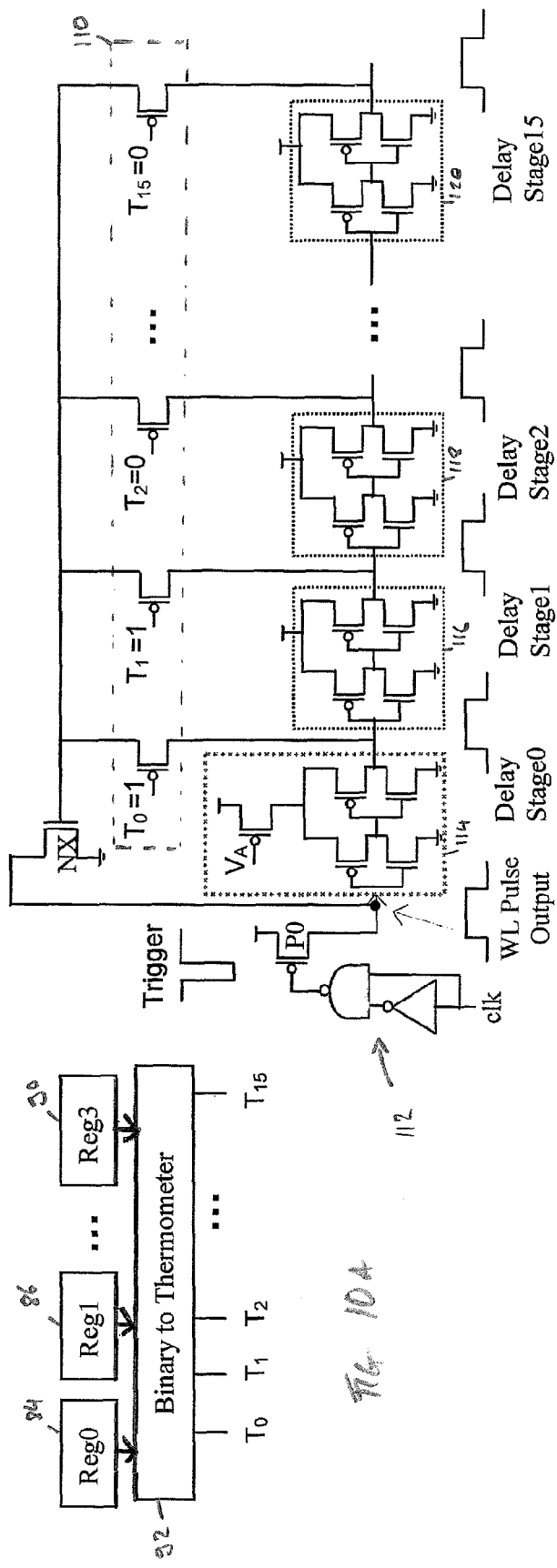

WORDLINE PULSE DURATION ADAPTATION IN A DATA STORAGE APPARATUS

BACKGROUND OF THE INVENTION

1. Field of the Invention

The present invention relates to the field of data processing. More particularly, this invention relates to an apparatus for storing data in an array of bitcells, wherein access to a selected bitcell in the array of bitcells requires assertion of a wordline pulse on a wordline associated with a row in which the selected bitcell is to be found.

2. Description of the Prior Art

In the context of an apparatus for storing data in an array of bitcells it is known that the duration of wordline pulse which a given bitcell requires in order to be able reliably to perform a read or write operation can vary in dependence on a range of factors. For example, the particular level of the supply voltage provided to the bitcell array and the temperature at which the bitcell array is operating can cause the wordline pulse duration threshold (defining the boundary between successful and unsuccessful operation) to vary. However, other factors such as fluctuations in component sizes due to manufacturing variation are also known to have an effect. These variations can be local—at the level of individual components—or globally across, say, an entire integrated circuit (e.g. variations in oxide thickness). As a result, it is known to adopt a "worst-case" design approach, where parameters such as the wordline pulse duration and the supply voltage are set to incorporate a safety margin such that reliable and robust operation of the apparatus containing the bitcell array can be ensured. There is however an undesirability to this approach in that the setting of the wordline pulse duration and supply voltage to cater for the worst-case scenario necessarily means that in many instances greater energy is being expended to operate the system than is strictly necessary.

In addition, as the development of bitcell designs pushes to smaller technology scales and lower supply voltages, the impact of these known variabilities increases and, according to the prior art techniques, would require an ever greater relative margin to be used in order to ensure reliable operation. However, in association with the drive towards smaller technology scales and lower supply voltages, there is also pressure to provide data storage devices which consume less energy and such increased margining does not align well with this goal.

SUMMARY OF THE INVENTION

Viewed from a first aspect, the present invention provides an apparatus for storing data comprising: an array of bitcells, the array comprising a plurality of rows of bitcells, wherein access to a selected bitcell in the array of bitcells requires assertion of a wordline pulse on a wordline associated with a row in which the selected bitcell is to be found; wordline pulse circuitry configured to generate the wordline pulse; sensor circuitry comprising a calibrated bitcell and a test wordline, wherein the calibrated bitcell is calibrated in a prior calibration process to use, in writing to the calibrated bitcell, a calibrated duration of wordline pulse on the test wordline which matches a longest wordline pulse required by any bitcell in the array of bitcells for a successful write operation to be carried out, wherein the sensor circuitry is configured to signal a wordline pulse duration to the wordline pulse circuitry based on the calibrated duration and wherein the wordline pulse circuitry is configured to generate the wordline pulse with the wordline pulse duration signalled by the sensor circuitry, and wherein the sensor circuitry is configured to adapt the wordline pulse duration in dependence on current local conditions in which the apparatus operates to compensate for influence of the current local conditions on the longest wordline pulse required by any bitcell in the array of bitcells.

The present technique recognises, with regard to an array of bitcells, that the determining factor in setting the required duration of a wordline pulse for that array of bitcells is the "slowest" bitcell in the array of bitcells, i.e. that bitcell which requires the longest wordline pulse in order to be able to carry out a successful write operation. The present technique provides sensor circuitry as part of the apparatus for storing data, this sensor circuitry comprising a calibrated bitcell. A prior calibration process is carried out on this calibrated bitcell, so that the wordline pulse used for a write process in this calibrated bitcell matches the longest wordline pulse required by any bitcell in the array of bitcells for a successful write operation to be carried out. Accordingly, the prior art techniques of margining in order to ensure that a successful write operation can be carried out are not required, since the longest wordline pulse required by the array of bits cells is actively measured in the calibration process rather than merely being estimated and allowed for.

The sensor circuitry is configured to signal the wordline pulse duration thus determined, such that wordline pulse circuitry—used in accessing the bitcells in the array of bitcells—can use a wordline pulse duration to match. Nevertheless, the present technique further recognises that current local conditions (such as the ambient temperature or the supply voltage level) can also influence the duration of the longest wordline pulse required by any bitcell in the array of bitcells for a successful write operation to be carried out, and accordingly the sensor circuitry is configured to adapt the wordline pulse duration in dependence on those current local conditions. In other words, the wordline pulse duration signalled by the sensor circuitry to the wordline pulse circuitry is varied as those local conditions vary.

One advantage of providing a calibrated bitcell within the sensor circuitry is that this calibrated bitcell will broadly respond to the current conditions in a similar way to the bitcells in the array of bitcells. For example, where a decrease in the supply voltage causes a longer wordline pulse duration to be required by the array of bitcells, this longer wordline pulse duration requirement will also be reflected by the calibrated bitcell. In another example, where an increase in the ambient temperature reduces the wordline pulse duration required by the array of bitcells, this shorter wordline pulse duration requirement will also be reflected by the calibrated bitcell.

The present technique thus, on the one hand, supports reliable access to the bitcell array by increasing the wordline pulse duration where necessary to enable that access, and on the other hand allows energy savings to be made where possible by decreasing the wordline pulse duration where this can be done. As a result, significant energy savings can be achieved by this dynamic adjustment of the wordline pulse duration. In the context of low power applications and System on Chips (SoCs), where the memory contributes significantly to the total SoC power consumption, this energy saving can be significant.

The sensor circuitry may be configured to signal the wordline pulse duration to the wordline pulse circuitry in a number of ways, but in some embodiments the sensor circuitry is configured to signal the wordline pulse duration to the wordline pulse circuitry by generating a signal wordline pulse which has the wordline pulse duration. As mentioned above, one advantage of providing a calibrated bitcell within the sensor circuitry is the feature that the environment in which the calibrated bitcell operates will closely reflect the environment in which the bitcells in the array of bitcells operates. Hence, a write operation in the calibrated bitcell will take place within a very similar context as a write operation in the array of bitcells. Moreover, where the calibrated bitcell has a test wordline which carries the calibrated wordline pulse for the calibrated bitcell, this test wordline can then be used as the source of the information of the current wordline pulse duration, by coupling this test wordline to the wordline pulse circuitry and allowing the wordline pulse circuitry to receive the signal wordline pulse which has the wordline pulse duration. An efficient and direct communication of the wordline pulse duration to the wordline pulse circuitry is thus supported.

In some embodiments, the sensor circuitry comprises trigger circuitry configured to activate the test wordline and the calibrated bitcell is configured such that activation of the test wordline begins a write process to invert a default value held by the calibrated bitcell, and the sensor circuitry comprises reset circuitry configured to deactivate the test wordline when the write process has successfully inverted the default value held by the calibrated bitcell.

This combination of trigger circuitry and reset circuitry thus enables the sensor circuitry to perform a "self test" on the calibrated bitcell, in which a wordline pulse on the test wordline results which reflects the time required for a write process to be carried out on the calibrated bitcell, by virtue of the fact that it is the successful completion of the write process which deactivates the test wordline and thus defines the end of the wordline pulse.

In some embodiments the reset circuitry is configured, when deactivating the test wordline, to cause the default value to be restored to the calibrated bitcell. This advantageously puts the calibrated bitcell back into a ready state for another test writing process to be carried out.

In some embodiments the sensor circuitry comprises a capacitance coupled to the test wordline, wherein the capacitance is calibrated to correspond to a wordline capacitance of one row of the plurality of rows of bitcells. This enables the calibrated bitcell to have timing characteristics which closely reflect those of the bitcells in the array of bitcells.

In some embodiments the sensor circuitry comprises bitline bias circuitry configured to apply a bias voltage to a bitline node coupled to the calibrated bitcell, wherein calibration of the calibrated bitcell in the prior calibration process comprises setting the bias voltage to cause the calibrated duration of wordline pulse on the test wordline to match the longest wordline pulse. The application of a bias voltage to a bitline node coupled to the calibrated cell enables the time required to perform a write to the calibrated bitcell to be varied (in dependence on the particular bias voltage applied) due to the effect that the biasing of the bitline node has on the voltage level changes which must take place within the calibrated bitcell during a write process. In turn this enables the corresponding wordline pulse duration to be adjusted.

In some embodiments the bitline bias circuitry comprises voltage divider circuitry, wherein the voltage divider circuitry comprises a plurality of voltage division paths coupled to the bitline node, and wherein each of the plurality of voltage division paths is selectively activated by a corresponding bit of a multi-bit calibration signal. The configuration of the bitline bias circuitry using voltage divider circuitry is advantageous because this enables a reliable bias voltage to be set which is less sensitive to environmental conditions (such as a variation in ambient temperature or a variation in the supply voltage) than a reference bias would be. Furthermore, different bitline bias voltages may readily be selected by the setting of the bits of the multi-bit calibration signal, providing an easily reconfigurable mechanism for setting different bias voltages.

In some embodiments the apparatus is further configured to perform an iterative calibration signal selection process to adapt the multi-bit calibration signal in the prior calibration process to cause the calibrated duration of wordline pulse on the test wordline to match the longest wordline pulse. Accordingly, the longest wordline pulse which has been determined with respect to the bitcells to the array of bitcells can thus be transferred to the calibrated bitcell, such that further operation of the calibrated bitcell enables this duration of wordline pulse to be generated in association with the operation of the calibrated bitcell.

In some embodiments the sensor circuitry comprises an access transistor which is configured to couple the bitline node to the calibrated bitcell, and the array of bitcells comprises bitcell array access transistors configured to couple an array bitline to the bitcells of the array of bitcells, and the access transistor is configured to switch faster than the bitcell array access transistors in the array of bitcells. As such the access transistor in the sensor circuitry may be arranged to switch faster than the equivalent array access transistors in the bitcell array. For example, it may be the case that the bitcell array access transistors in the bitcell array selectively couple the respective bitcells to an adjacent bitline on one side of the respective bitcells, and the equivalent access transistor for the calibrated bitcell (i.e. coupling the calibrated bitcell to the bitline node on the same side) can thus be selected to be made faster. Configuring the access transistor in this manner is advantageous because as a result the wordline pulse duration of the sensor circuitry will be very likely to be smaller than the longest wordline pulse determined for the array of bitcells. This consequently means that only a positive voltage bias need be applied to the bias voltage in order to calibrate the calibrated bitcell to match the slowest bitcell in the bitcell array (the one that requires the longest wordline pulse). This in turn is advantageous because typical data processing systems (e.g. provided as a SoC) are generally not provided with a negative supply rail and the required bias is thus very likely to be able to be provided by an existing positive supply rail.

In some embodiments the access transistor is sized relative to the bitcell array access transistors such that an expected distribution after manufacturing of the wordline pulse duration generated by the calibrated bitcell before the prior calibration process is carried out has a majority of data points at lower durations than data points of an expected distribution after manufacturing of the longest wordline pulse. The present technique recognises that, due to the different variations that can occur (both global and local), a range of wordline pulse durations is to be expected for the uncalibrated bitcell (i.e. the calibrated bitcell before the prior calibration process is carried out). Similarly it is recognised that, due the same variations, a range of longest wordline pulses (i.e. the longest wordline pulse required by any bitcell in the array of bitcells for a successful write operation to be carried out) is also to be expected. Advantageously the present techniques arrange that the majority of data points of the former range lie at lower durations than the data points of the latter range. In turn this then means that, in the majority of cases, the sensor circuitry can be calibrated using a positive voltage bias to match the longest wordline pulse required in the array of bitcells. Whilst this may mean that there exists a minority of cases in which the calibrated bitcell of the sensor circuitry can only generate a longer wordline pulse than is required to match the longest wordline pulse required in the array of bitcells, reliable operation of the bitcell array is nonetheless supported. Depending on the expected variation in these two ranges, a useful trade-off can thus be supported between allowing the calibrated bitcell of the sensor circuitry more often to be able to precisely match the longest wordline pulse required in the array of bitcells and the increased range of calibration which must be provided to support this.

In some embodiments the sensor circuitry is configured, in response to a change in the current local conditions, to carry out a test write operation on the calibrated bitcell to determine a new wordline pulse duration. Accordingly when such a variation in the current local conditions occurs, which could have had an effect on the required wordline duration, the sensor circuitry can determine the new wordline pulse duration in response. There could be a variety of particular current local conditions to which the sensor circuitry may be configured to adapt, but in some embodiments the sensor circuitry comprises a voltage sensor configured to determine a change in a voltage supply used by the apparatus. Similarly, in some embodiments the sensor circuitry comprises a temperature sensor configured to determine a change in local temperature.

In some embodiments the apparatus further comprises self-testing circuitry configured to perform the prior calibration process comprising initially setting the wordline pulse to have a predetermined minimum duration, followed by iteratively testing each row in the array of bitcells, wherein testing each row comprises writing to that row followed by reading from that row to determine if the writing to that row was successful, and incrementing the duration of the wordline pulse until every row in the array of bitcells has been successfully written to, to thus determine the longest wordline pulse. This exhaustive iterative process thus enables the longest wordline pulse to be determined for any bitcell in the bitcell array.

In some embodiments the self-testing circuitry is further configured to perform the prior calibration process such that testing each row comprises:

writing a sequence of 0s to that row followed by reading from that row and determining if the writing of 0s to that row was successful; and writing a sequence of 1 s to that row followed by reading from that row and determining if the writing of is to that row was successful. Accordingly, by testing the writing of both 0s and 1s to each row, it is ensured that there is no dependency of the performance of the calibrated apparatus on the data it is required to store, i.e. a bias in the longest wordline pulse duration in dependence on whether a 0 or a 1 is required to be written.

In some embodiments the wordline pulse circuitry comprises wordline pulse quantization circuitry configured to sample the signal wordline pulse generated by the sensor circuitry and wordline pulse registers configured to store a quantization result generated by the wordline pulse quantization circuitry, wherein the wordline pulse circuitry is configured to generate the wordline pulse with a duration specified by the quantization result stored in the wordline pulse registers. In embodiments in which the sensor circuitry is configured to signal the wordline pulse duration to the wordline pulse circuitry by generating a signal wordline pulse which has the wordline pulse duration, this thus enables the wordline pulse circuitry to capture the wordline pulse duration in a readily storable format and to store that duration for future reference.

The wordline pulse quantization circuitry may take a variety of forms, but in some embodiments the wordline pulse quantization circuitry comprises a sequence of delay stages configured to receive the signal wordline pulse and a set of pass gates coupled to intermediate nodes between the delay stages, wherein each pass gate in the set of pass gates is configured to transmit a signal from a respective intermediate node when that pass gate is open, and the respective gates of the set of pass gates are coupled together and configured to receive the signal wordline pulse, such that the set of pass gates are opened by a starting edge of the signal wordline pulse and are closed by an ending edge of the signal wordline pulse, and comprising capture circuitry configured to capture the signals from the respective intermediate nodes via the pass gates as the quantization result. Using a set of pass gates coupled to the respective intermediate nodes to transmit a signal from each respective intermediate node when that pass gate is open advantageously reduces the capacitive loading at each respective intermediate node. In turn this reduces the energy consumption associated with operating this wordline pulse quantization circuitry. Furthermore this allows for a more accurate measurement of the wordline pulse duration by reducing the additional delay associated with each delay stage.

In some embodiments, the capture circuitry comprises thermometer to binary conversion circuitry configured to generate a set of binary values in dependence on a thermometer value represented by the signals from the respective intermediate nodes via the pass gates. This enables the signals from the respective intermediate nodes via the pass gates to be converted into a format which is readily and efficiently stored in the wordline pulse registers.

In some embodiments a first delay stage of the sequence of delay stages is configured to have a delay corresponding to a minimum expected wordline pulse duration for the array of bitcells. This advantageously reduces the number of delay stages which need to be provided for the wordline pulse quantization circuitry to be able to capture the wordline pulse duration in quantized form and in turn reduces the energy consumption associated with operating this wordline pulse quantization circuitry.

In some embodiments the wordline pulse circuitry comprises binary to thermometer conversion circuitry configured to generate a set of signals in a thermometer value representation from a set of binary values given by the quantization result stored wordline pulse registers. This enables the content of the wordline pulse registers to be readily and efficiently converted into a format which is suitable for conversion into a wordline pulse of defined duration, for example by controlling a set of pass gates.

In some embodiments the wordline pulse circuitry comprises wordline pulse generation circuitry configured to generate the wordline pulse at an output node and comprising a sequence of delay stages and a set of pass gates coupled to intermediate nodes between the delay stages, wherein each pass gate in the set of pass gates is configured to be open when a respective signal from the set of signals in thermometer representation is not asserted, and respective outputs of the set of pass gates are coupled together and coupled to pulse termination circuitry, such that a starting edge received at the output node is propagated through the sequence of delay stages until the starting edge reaches an selected intermediate node coupled to an open pass gate and the starting edge activates the pulse termination circuitry to generate a ending edge at the output node. Similarly to the configuration mentioned above, the use of a set of pass gates coupled to the respective intermediate nodes to convert the set of signals in thermometer representation into a wordline pulse of given duration advantageously reduces the capacitive loading at each respective intermediate node. Again, this then reduces the energy consumption associated with operating this wordline pulse quantization circuitry. Furthermore this allows for a more accurate generation of the wordline pulse duration by reducing the additional delay associated with each delay stage.

In some embodiments a first delay stage of the sequence of delay stages is configured to have a delay corresponding to a minimum expected wordline pulse duration for the array of bitcells. This advantageously reduces the number of delay stages which need to be provided for the wordline pulse quantization circuitry to be able to generate the wordline pulse having a duration given by the values stored in the wordline pulse registers and in turn reduces the energy consumption associated with operating this wordline pulse quantization circuitry.

Viewed from another aspect the present invention provides a method of adapting a duration of a wordline pulse in an apparatus for storing data comprising an array of bitcells, the array comprising a plurality of rows of bitcells, wherein access to a selected bitcell in the array of bitcells requires assertion of the wordline pulse on a wordline associated with a row in which the selected bitcell is to be found, the method comprising the steps of:

performing a prior calibration process, with respect to sensor circuitry comprising a calibrated bitcell and a test wordline, to adapt the calibrated bitcell to use, when the calibrated bitcell is written to, a calibrated duration of wordline pulse on the test wordline which matches a longest wordline pulse required by any bitcell in the array of bitcells for a successful write operation to be carried out;

signalling a wordline pulse duration based on the calibrated duration;

generating the wordline pulse with the wordline pulse duration signalled; and adapting the wordline pulse duration in dependence on current local conditions in which the apparatus operates to compensate for influence of the current local conditions on the longest wordline pulse required by any bitcell in the array of bitcells.

Viewed from another aspect the present invention provides an apparatus for storing data, comprising:

an array of bitcells, the array comprising a plurality of rows of bitcells, wherein access to a selected bitcell in the array of bitcells requires assertion of the wordline pulse on a wordline associated with a row in which the selected bitcell is to be found;

means for generating the wordline pulse;

means for performing a prior calibration process, with respect to sensor circuitry comprising a calibrated bitcell and a test wordline, to adapt the calibrated bitcell to use, when the calibrated bitcell is written to, a calibrated duration of wordline pulse on the test wordline which matches a longest wordline pulse required by any bitcell in the array of bitcells for a successful write operation to be carried out;

means for signalling a wordline pulse duration based on the calibrated duration to the means for generating the wordline pulse;

means for adapting the wordline pulse duration in dependence on current local conditions in which the apparatus operates to compensate for influence of the current local conditions on the longest wordline pulse required by any bitcell in the array of bitcells.

BRIEF DESCRIPTION OF THE DRAWINGS

The present invention will be described further, by way of example only, with reference to embodiments thereof as illustrated in the accompanying drawings, in which:

FIG. 9 schematically illustrates wordline pulse quantization circuitry in one embodiment;

FIGS. 10A and 10B schematically illustrate wordline pulse generation circuitry in one embodiment;

DESCRIPTION OF THE PREFERRED EMBODIMENTS

Figure 1:
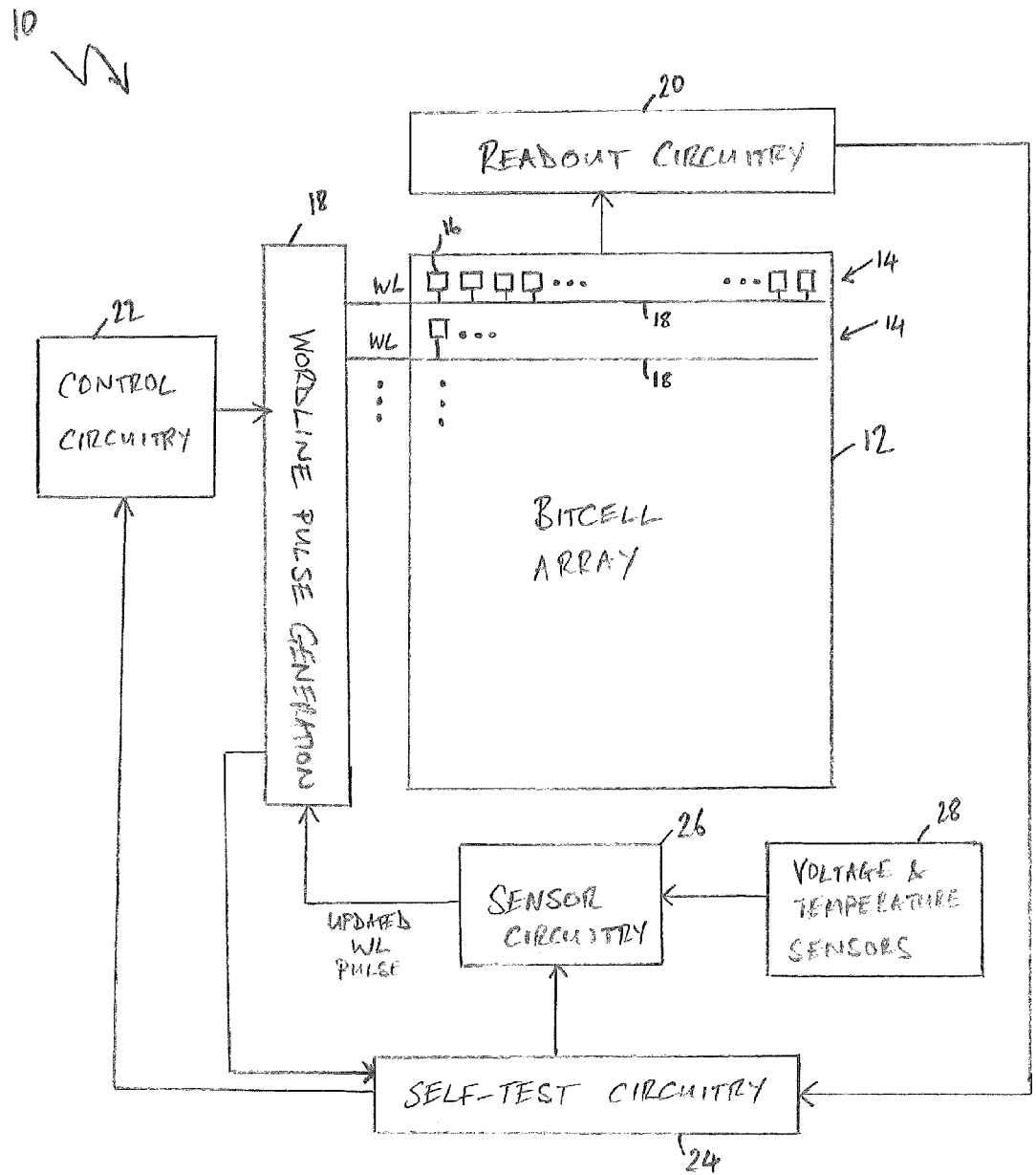
FIG. 1 schematically illustrates an apparatus for storing data comprising a bitcell array and associated sensor circuitry in one embodiment.

FIG. 1 schematically illustrates an apparatus 10 for storing data in one embodiment. The apparatus 10 comprises a bitcell array 12 in which rows 14 of individual bitcells 16 are provided. Each row 14 of bitcells has an associated wordline 18 on which a wordline pulse must be asserted when access to a selected bitcell 16 in that row is to be carried out. The wordline pulse generated for each wordline 14 is provided by the wordline pulse circuitry 18. Although only schematically illustrated in FIG. 1, the bitcell array 12 represents a 78 kbit SRAM array manufactured at the 28 nm technology node.

The array has 256 rows and 4 columns, each having a word with a size of 78 bits. The bitcell array 12 also has associated read-out circuitry 20 (coupled to the bit lines of the bitcell array 12 and not described in further detail here). The apparatus 10 comprises control circuitry 22 which is configured to control the operation of the wordline pulse circuitry 18. In particular in the context of the present techniques, the control circuitry 22 is configured to configure the wordline pulse circuitry 18 to participate in a built-in self-test (BIST) process the operation of which is determined by the self-test circuitry 24 which also forms part of the apparatus 10.

The apparatus 10 further comprises sensor circuitry 26 which is configured to signal a wordline pulse duration to the wordline pulse circuitry 18 to configure the duration of wordline pulse which the wordline pulse circuitry 18 applies to the wordlines 14. As will be described in more detail with reference to the following figures, the sensor circuitry 26 is configured to do this in response to control by the self-test circuitry 24, but is also configured to do this during the on-going (i.e. not during self-test) operation of the apparatus 10. As part of that on-going operation, the sensor circuitry 26 receives information from the voltage and temperature sensors 28, which provide an indication of the current local conditions in which the apparatus 10 is operating, and trigger the sensor circuitry 26 to vary the wordline pulse duration which it signals to the wordline pulse generation circuitry 18.

Figure 2B:
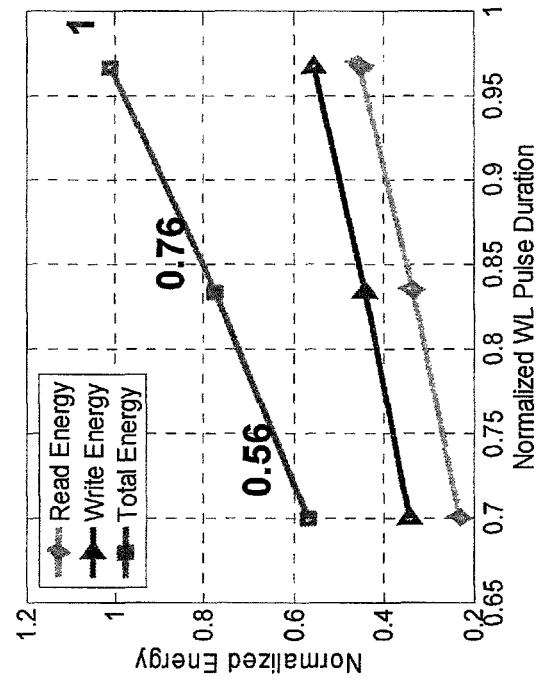
FIG. 2B shows the correspondence of the energy consumption with the wordline pulse duration range shown in FIG. 2A.
Figure 2A:
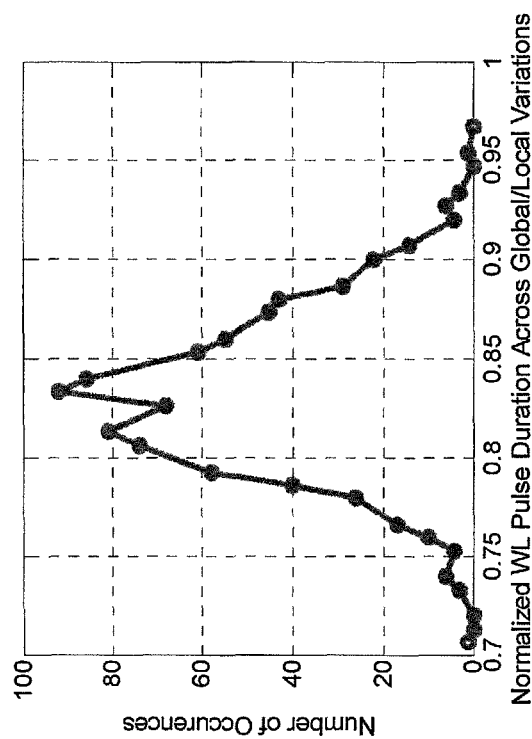
FIG. 2A shows the distribution of wordline pulse duration required to successfully perform read and write operations on an example bitcell array in one embodiment.
Figure 3:
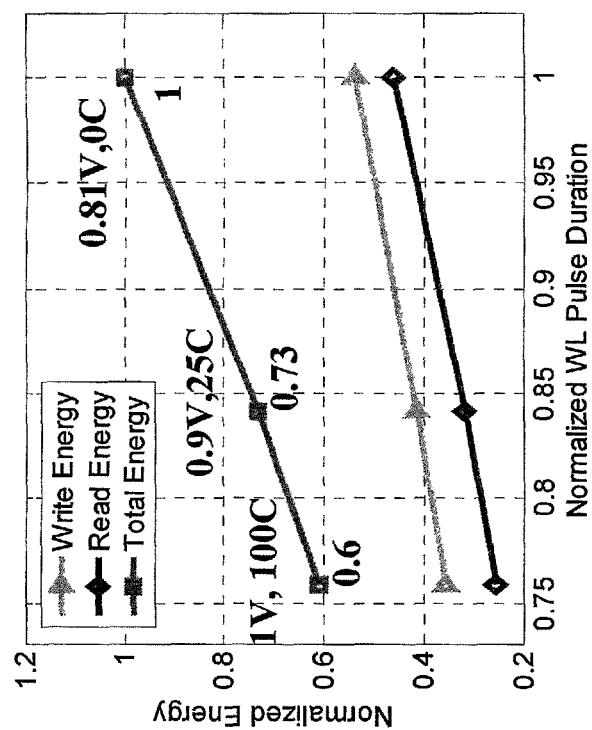
FIG. 3 shows the variation of the required wordline pulse duration with supply voltage and operating temperature, and the corresponding variation in energy consumption in one embodiment.

Some of the benefits which may be achieved by means of the present techniques may be better understood with reference to FIGS. 2A, 2B and FIG. 3. FIG. 2A shows the distribution of wordline pulse durations which are required to successfully perform a robust read or write operation on the bitcells in a 78 kbit SRAM array (such as that schematically illustrated in FIG. 1) across the expected global and local process variations at the 28 nm technology node. Note that this distribution is given with respect to a normalised wordline duration scale, and on this scale it can be seen that the bitcells require pulse durations ranging from approximately 0.7 to just above 0.95. This distribution of normalised wordline pulse durations is also represented in FIG. 2B, showing the normalised energy expenditure associated therewith. The energy expenditure is broken down into the energy associated with a read process (diamonds), the energy associated with a write process (triangles) and the total dynamic energy expenditure—defined as the sum of the read and write energies— (squares). It can clearly be seen that the write process is the more expensive in terms of energy expenditure, and further that increasing the wordline pulse duration increases the dynamic energy consumption. This is due to the increased pre-charge, wordline driver and bitline driver energies. However, further considered in the context of the prior art margining technique in which the wordline pulse duration is set to cater for the worst-case scenario (i.e. to cover the longest wordline pulse duration required within the SRAM array) it can be seen that total energy savings of up to 44% can be achieved, since the energy expenditure for the shortest wordline pulse durations required—at a normalised total energy of 0.56—represents a reduction of 44% with respect to the energy expenditure associated with the longest wordline pulse duration required—at a normalised energy value of 1.00.

FIG. 3 further shows the variation in normalised energy consumption associated with the read and write processes on the same 78 kbit SRAM array across a range of supply voltage and operating temperature. The normalised wordline pulse duration required to successfully perform these read and write processes in a robust manner is shown. The prior art worst-case design approach usually allows for ±10% variation in the supply voltage and an operating temperature range of 0-100 C. The selected data points shown in FIG. 3 correspond to the outer limits of these supply voltage and temperature ranges around a central nominal operating voltage of 0.9V and ambient temperature of 25 C. A 10% drop in the supply voltage (to 0.81V) and an ambient temperature of 0 C corresponds to the longest (normalised to 1.0 in the figure) wordline pulse duration, also having the greatest corresponding dynamic energy consumption (also normalised to 1.0 in the figure). By contrast, a 10% increase in the supply voltage (to 1V) and an ambient temperature of 100 C gives a reduced dynamic energy consumption of 0.6 (normalised) at a shorter wordline pulse duration of 0.76 (normalised). Accordingly, it can be seen that total energy savings of up to 40% can be achieved by adjusting the wordline pulse duration to allow for local supply voltage and temperature variations.

Figure 4B:
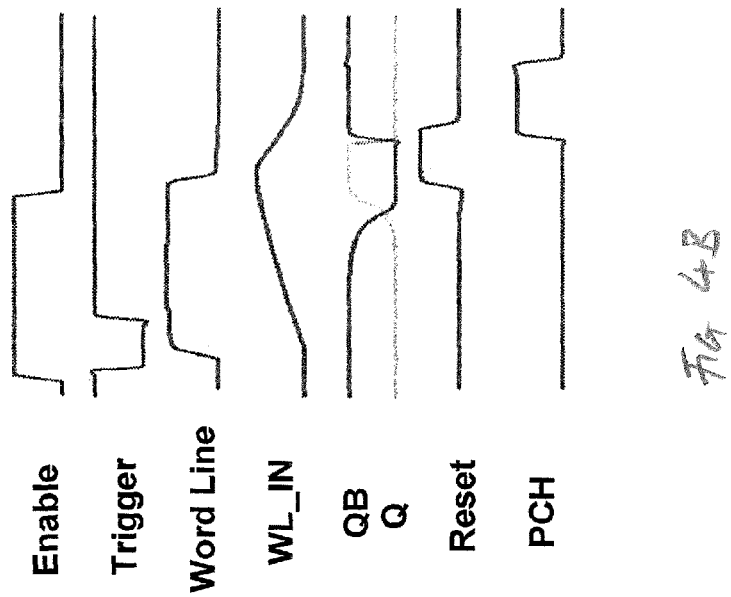
FIG. 4B shows an example set of wave forms for the circuitry shown in FIG. 4A.
Figure 4A:
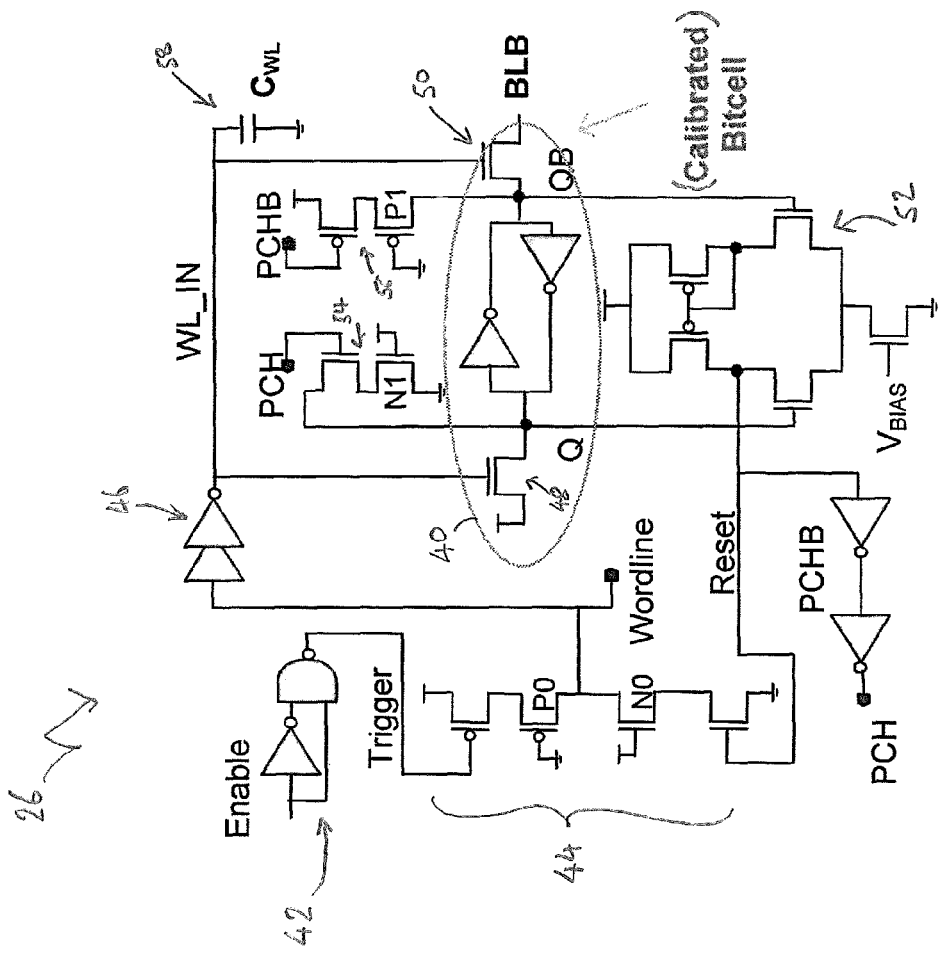
FIG. 4A schematically illustrates sensor circuitry comprising a calibrated bitcell in one embodiment.

FIG. 4A schematically illustrates in more detail some of the components of the sensor circuitry 26 (see FIG. 1) by means of which the present technique allows the above mentioned energy savings to be accessed. A central feature of the sensor circuitry 26 is the (calibrated) bitcell 40, which essentially correspond in construction to the construction of the bitcells 16 which are to be found in the bitcell array 12. The calibration of this (calibrated) bitcell 40 is performed in a prior calibration process, i.e. before normal operation (read/write access) with respect to the bitcell array 12 is allowed to be performed. This prior calibration process is performed under the control of the self-test circuitry 24 as will be described in more detail below. The minimum word line pulse duration which is required to successfully write to a memory bitcell is defined as $T_{crit}$. It has previously been shown that with technology scaling the required wordline pulse duration is very likely to be higher for write operations than for read operations and hence $T_{crit}$ can be used to successfully perform both the read and write operations. Accordingly, in order to calibrate the (calibrated) bitcell 40, the self-test circuitry 24 measures the $T_{crit}$ of the worst-case (i.e. slowest) bitcell in the bitcell array and calibrates the bitcell 40 to match (by appropriate setting of the voltage at BLB—to be described in more detail below) to adjust the $T_{crit}$ of the sensor circuitry 26 (i.e. of the bitcell 40) to be the same as that of the worst-case bitcell.

Thus calibrated, the sensor circuitry 26 can be used to generate a wordline pulse which corresponds to that required for a write process to be successfully carried out on the worst-case bitcell in the bitcell array. The generation of such a wordline pulse is performed as follows. The calibrated bitcell 40 initially stores a logical value of 0. When the "Enable" signal is asserted (refer also to FIG. 4B which shows example waveforms for the operation of the sensor circuitry 26 shown in FIG. 4A), the trigger signal generation circuitry 42 generates a "Trigger" pulse which (via the PMOS/NMOS cascade 44) causes the wordline to be asserted, i.e. the wordline pulse to begin. Note that PMOS transistor P0 and NMOS transistor N0 are used to decouple the switching effect from the wordline signal. Once asserted, the wordline signal, via buffer 46, as the input signal WL_IN causes the access transistors 48 and 50 of the calibrated bitcell 40 to open, starting the process of writing a logical 1 to the bitcell. Q and QB start charging and discharging respectively. Once Q crosses QB the reset circuitry 52, which operates on the basis of a comparison between the values Q and QB, causes the "Reset" signal to be asserted. This deactivates the "Wordline" signal (i.e. ends the wordline pulse) indicating the end of the write operation to the calibrated bitcell. As a final step, the Reset signal is also used to assert the signals PCH and PCHB which reset the calibrated bitcell, causing a logical 0 to be stored again ready for the next text write operation. Note that PCH and PCHB are applied to the respective sides of the calibrated bitcell via the NMOS cascade 54 and PMOS cascade 56 respectively, which incorporate transistors N1 and P1 to decouple the switching effect from the Q and QB nodes. Note also that the capacitor $C_{WL}$ 58 is coupled to the calibrated bitcell 40 and has a value equivalent to the wordline capacitance of one row 14 in the bitcell array 12, to enable the calibrated bitcell 40 to have a similar initial wordline pulse duration requirement as the expected worst-case SRAM bitcell. Note that the setting of this capacitance $C_{WL}$ need not be exact because of the calibration of the calibrated bitcell 40 which can be performed (see below).

Figure 5B:
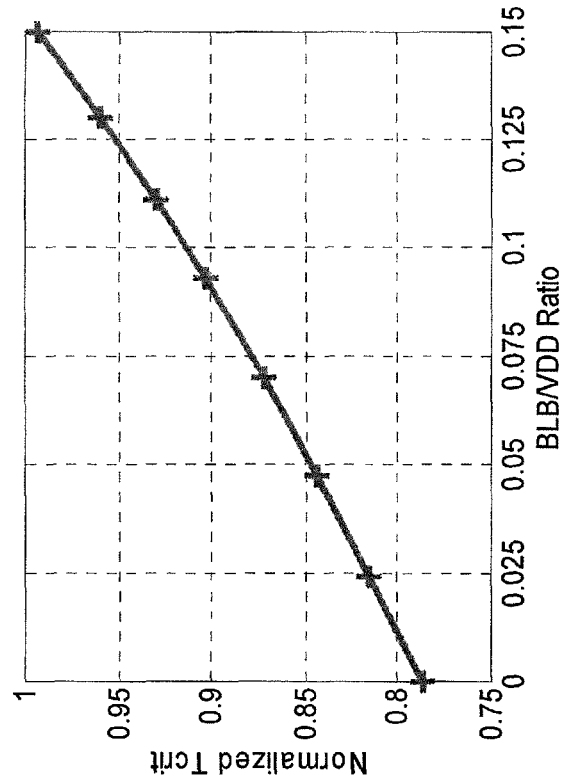
FIG. 5B shows the variation of the minimum wordline pulse duration with a relative bitline bias voltage value provided by the bitline bias circuitry shown in FIG. 5A in one embodiment.
Figure 5A:
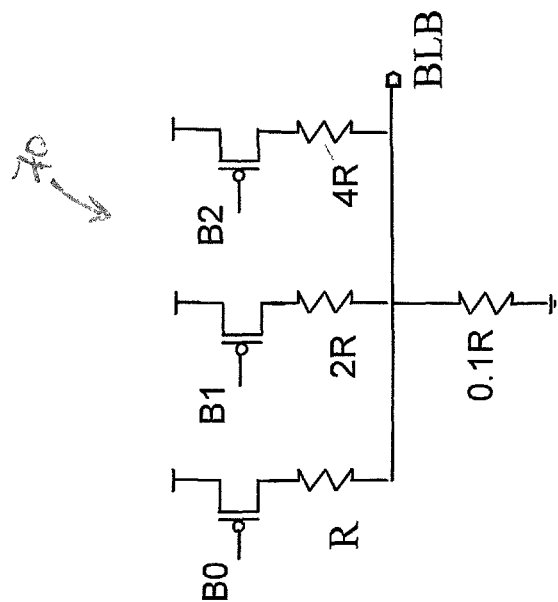
FIG. 5A schematically illustrates bitline bias circuitry in one embodiment.

The calibration of the calibrated bitcell 40 in the sensor circuitry 26 is performed through a digital setting of the voltage at BLB, using the bitline bias circuitry 70 schematically shown in FIG. 5A. This follows a built-in self-test (BIST) process initially carried out under the control of the self-test circuitry 24 (see FIG. 1) to measure $T_{crit}$ of the worst-case (i.e. requiring the longest wordline pulse duration) bitcell in the bitcell array 12. The values B0, B1 and B2 are selected in order to set the BLB voltage. B0, B1 and B2 control the respective paths through the voltage divider circuitry 70, these voltage division paths being provided with respectively doubled resistances with respect to one another such that range of BLB voltage values can be selected by appropriate setting of the B0-B2 control values. The use of a voltage divider for setting the BLB value is particular advantageous for keeping the calibrated bitcell 40 tuned to the worst-case bitcell in the bitcell array 12 as voltage supply/ambient temperature variations occur, since if a reference bias was used instead an increase in the supply voltage would increase the dynamic margin of the sensor calibrated bitcell 40 more than that of the worst-case bitcell in the bitcell array and hence the required performance matching would not be achieved. FIG. 5B shows the distribution of the normalised $T_{crit}$ of the calibrated bitcell 40 against the BLB/VDD ratio across the global and process variations mentioned above. It can be seen that the value of R has been chosen such that BLB/VDD ratios in the range 0-0.15 can be achieved.

The present techniques further recognise that local process variations could set the $T_{crit}$ of the bitcell 40 of the sensor circuitry 26 (before calibration) to be higher or lower than that of the worst-case memory bitcell. Generally this could therefore mean that a negative voltage at BLB might be needed in order to bias BLB in the case that these local process variations resulted in $T_{crit}$ of the sensor bitcell being greater than that of the worst-case memory bitcell. Given that most system-on-chip (SoC) arrangements don't have access to a negative supply rail, the present technique provides that the right-hand access transistor 50 (see FIG. 4A) of the bitcell 40 in the sensor circuitry 26 is intentionally "upsized" to be three times larger than the equivalent access transistor in the SRAM bitcells 16. This ensures that it is very likely that the sensor circuitry bitcell 40 will have a smaller $T_{crit}$ than that of the worst-case SRAM bitcell 16, and hence that only a positive bias of BLB is required.

Figure 6:
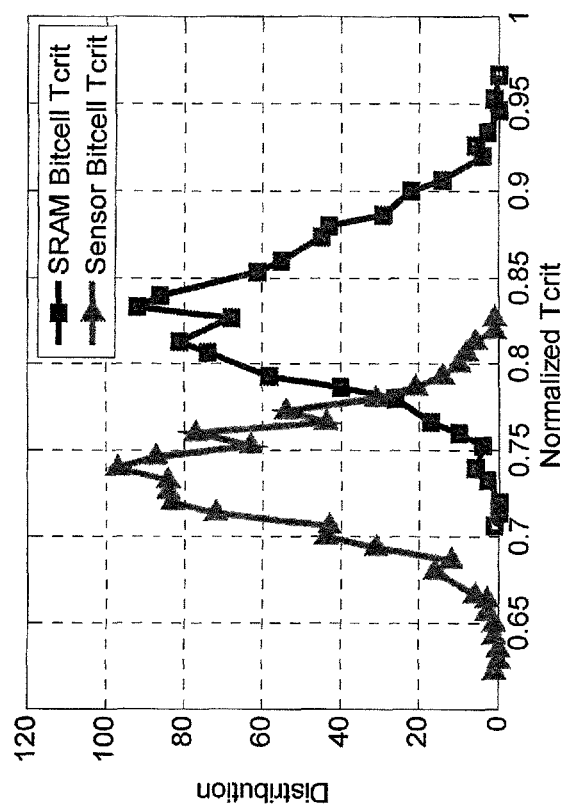
FIG. 6 shows the expected distribution after manufacture of the minimum wordline pulse duration required to successfully perform a write operation in the calibrated bitcell of the sensor circuitry compared to the expected distribution after manufacture of the longest wordline pulse duration required to successfully write to the bitcells in an array of bitcells in one embodiment.

FIG. 6 shows the normalised expected distribution of $T_{crit}$ after manufacture for the sensor bitcell and for a SRAM bitcell across the expected global and process variations. It can be seen that a majority of the $T_{crit}$ values for the sensor bitcell lie at lower $T_{crit}$ values than those for the SRAM bitcell, meaning that in the majority of cases the sensor bitcell can be calibrated to have the (longer) $T_{crit}$ value of the worst-case SRAM bitcell. It is recognised that there is a small overlap area between the sensor bitcell $T_{crit}$ values and the SRAM bitcell $T_{crit}$ values for which the available positive bias which may be applied to BLB will be unable to correct the sensor bitcell to match the $T_{crit}$ of the SRAM bitcell, but a robust write process with respect to this SRAM bitcell is nevertheless assured, since this only means that a longer wordline pulse duration than is strictly necessary will be generated. Although it would be possible to arrange the distributions of the $T_{crit}$ values for the SRAM bitcell and the sensor bitcell such that all occurrences could be corrected by a positive bias applied to BLB, this would come at the price of a greater range of BLB bias being required to be provided.

Figure 7:
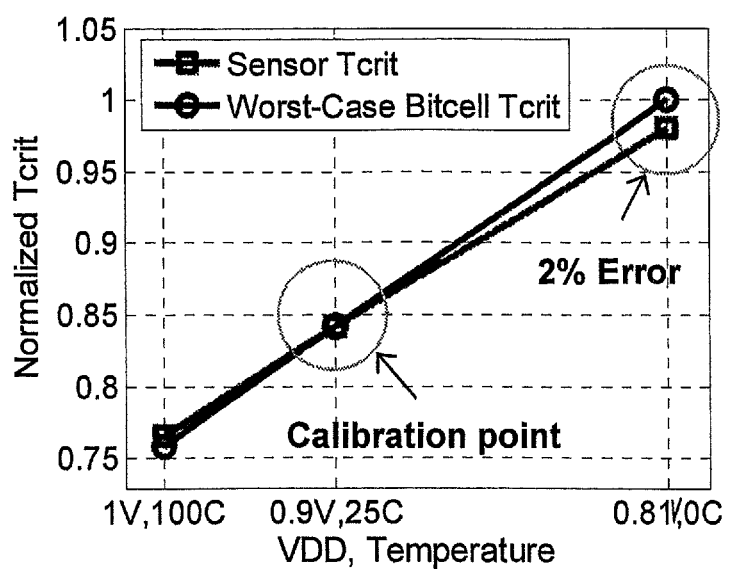
FIG. 7 shows the calibration of the calibrated bitcell in the sensor circuitry in one embodiment.

FIG. 7 shows the calibration of the sensor circuitry 26 to the worst-case bitcell of the 78 kbit bitcell array 12 at the typical operating point (0.9V, 25 C). Having been calibrated at this calibration point, FIG. 7 demonstrates the range of calibration of this sensor circuitry 26, from the shortest $T_{crit}$ (at 1V and 100 C) to the longest $T_{crit}$ (at 0.81 V and 0 C). Overall it can be seen that the sensor circuitry 26 accurately adjusts the word line pulse duration which is needed to write to this worst-case bitcell in the bitcell array. It is noted that there is a small deviation (approximately 2% error) in the value of the longest $T_{crit}$ (at 0.81V, 0 C), however this is not significant to the performance of the overall apparatus and is readily compensated for in the wordline control scheme which utilises this sensor circuitry 26.

Figure 8:
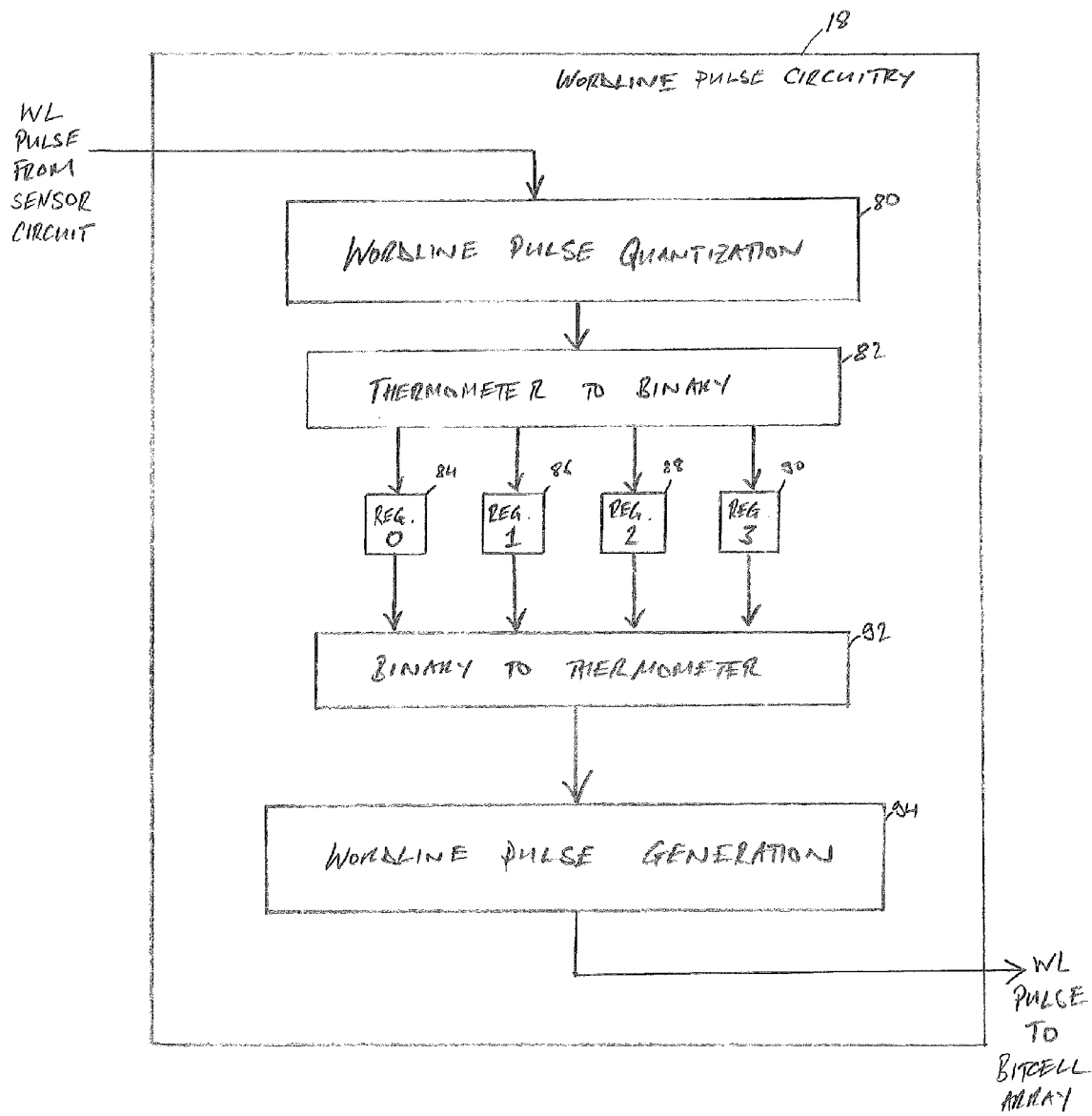
FIG. 8 schematically illustrates wordline pulse circuitry in one embodiment.

FIG. 8 schematically illustrates an overview of the configuration of the wordline pulse circuitry 18, which receives the wordline pulse generated by the sensor circuit 26. The wordline pulse circuitry 18 is configured to determine the duration of the wordline pulse received from the sensor circuit and store this duration by means of a set of values held in registers 84, 86, 88, 90 within the wordline pulse circuitry. Accordingly, in a first stage the wordline pulse received from the sensor circuit 26 is received by wordline pulse quantization circuitry 80 which is configured to convert the wordline pulse into a thermometer value, this thermometer value being passed to thermometer to binary circuitry 82, which in turn converts this thermometer value into a binary value which is then stored in the registers 84-90. The wordline pulse circuitry 18 is provided with a second stage configured to convert a set of values stored in the registers 84-90 into a wordline pulse of a corresponding duration. The values stored in the registers 84-90 are received by the binary to thermometer circuitry 92 which converts this binary value into a thermometer value, which is passed to the wordline pulse generation circuitry 94, which in turn generates a wordline pulse with the defined duration. More detail of this first quantization stage and second generation stage are described below with reference to FIGS. 9, 10A and 10B.

FIG. 9 schematically illustrates in more detail the configuration of the above mentioned "first stage" of the wordline pulse circuitry 18 at which a received wordline pulse from the sensor circuitry is converted into binary values which are stored in the registers 84-90. The wordline pulse quantization circuitry comprises 16 delay stages (of which only stages 100, 102, 104 and 106 are shown) through which the wordline pulse received from the sensor circuit is passed. The first delay stage ("Delay Stage 0") 100 is configured such that the delay it applies to the signal received is tuned by the bias voltage $V_A$ to correspond to the minimum wordline pulse duration which is expected to be required for the bitcell array when allowing for global and local variations (see FIG. 2A, i.e. the left-hand most data point in the distribution). The subsequent 15 delay stages of the quantization circuitry then provided delays which correspond to the full range of wordline pulse durations which is expected to be required for the bitcells of the bitcell array (i.e. covering the full range of wordline pulse durations shown in FIG. 2A). In addition to the delay stages 100, 102, 104, 106, the wordline pulse quantization circuitry further comprises pass gates P0-P15 which are used to sense the internal nodes N0-N15 of the delay line. Each of these nodes is initially discharged to zero. The input of the wordline pulse quantization circuitry which receives the wordline pulse from the sensor circuit couples the wordline pulse to the gate of each of the pass gates P0-P15. Accordingly when the wordline pulse goes high each of these (PMOS) pass gates turns on. In parallel, the rising edge of the wordline pulse in propagated along the delay line (i.e. from N0 towards N15), such that once the wordline pulse goes low the pass gate P0-P15 are turned off and the internal nodes of the delay line which the rising edge of the wordline pulse had already reached are sensed as having a value of 1, whilst nodes which had not been reached by the rising edge of the wordline pulse are sensed as having a value of 0. This thus represents the thermometer value which is passed to the thermometer to binary circuitry 82 from the pass gates P0-P15. The thermometer to binary circuitry 82 then converts this thermometer value to an equivalent binary value which is stored in the 4-bit registers 84-90.

FIGS. 10A and 10B illustrate in more detail the configuration of the second stage of the wordline pulse circuitry 18, namely the wordline pulse generation circuitry which is used to generate the required wordline pulse duration for the bitcell array 12 from the content of the registers 84-90. A binary code retrieved from the registers 84-90 is converted to a thermometer code by the binary code by the binary to thermometer circuitry 92 and this thermometer value is applied to the set of pass gates 110. Thereafter, when the clock signal (clk) is asserted the pulse generation circuitry 112 generates a trigger signal which provides the rising edge of the wordline pulse. This wordline pulse rising edge then propagates along the delay line formed by the set of delay stages 114, 116, 118, 120. The rising edge propagates until it reaches a delay stage where the corresponding pass gate is connected to a zero thermometer code value, this providing an open path through the corresponding pass gate for the rising edge to open the further pass gate (NMOS) NX which resets the wordline pulse (i.e. provides its concluding, falling edge). Note that the first delay stage 114 of the sequence of delay stages shown in FIG. 10B is, like the delay stage 100 shown in FIG. 9A, tuned via a bias voltage $V_A$ to correspond to the expected minimum wordline pulse duration.

Figure 11B:
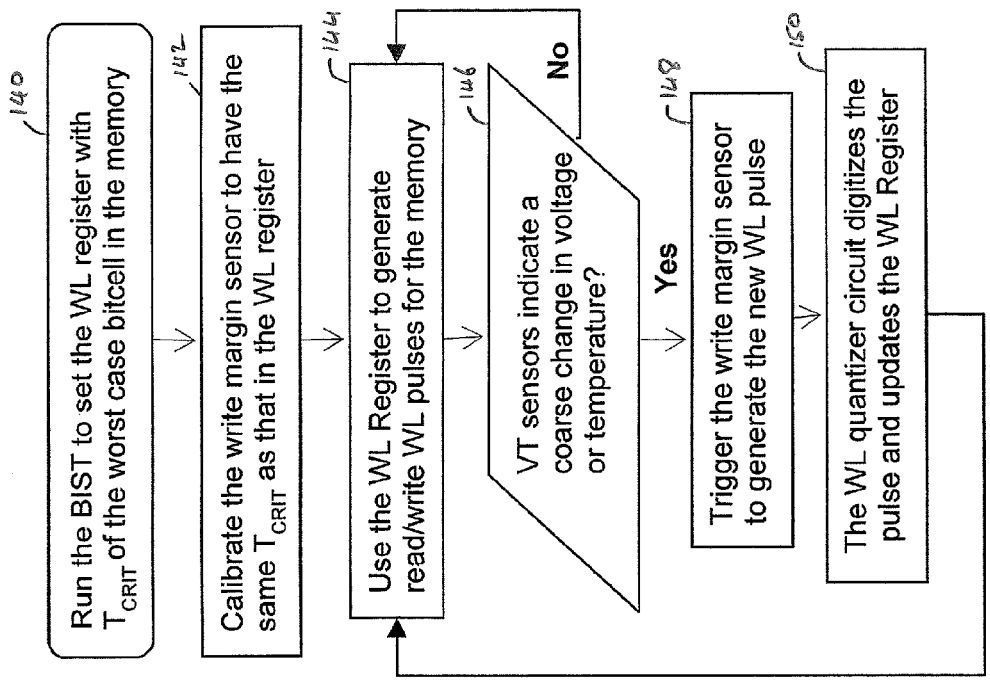
FIG. 11B schematically illustrates a series of steps which are taken in apparatus for storing data in one embodiment to initially calibrate the sensor circuitry and then to adapt the wordline pulse duration in response to variations in local conditions.
Figure 11A:
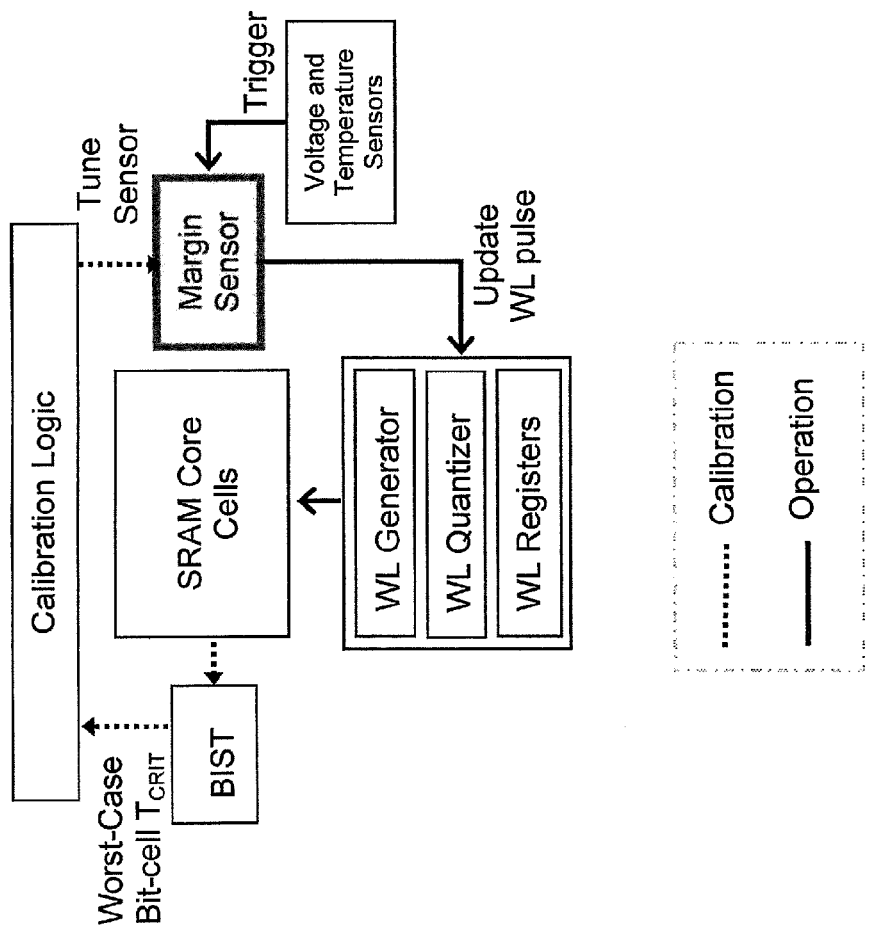
FIG. 11A schematically illustrates apparatus for storing data in one embodiment.

FIGS. 11A and 11B provide a schematic overview of the operation of the system both in an initial calibration phase and in its subsequent regular operation. In the initial calibration phase a built-in self-test (BIST) process is run in order to determine the $T_{crit}$ of the worst-case bitcell in the bitcell array 12. This value is then used to calibrate the margin sensor (sensor circuitry 26) such that in the on-going regular operation of the memory the margin sensor can be triggered by a variation in the locally detected voltage or temperature in order to generate a new wordline pulse, which is then received by the wordline quantizer and causes the values stored in the wordline registers to be updated such that an amended wordline pulse duration is applied to the SRAM core cells. The steps of these processes are schematically illustrated in FIG. 11B. At a first step 140, the BIST process is run in order to set the wordline registers to correspond to the $T_{crit}$ of the worst-case bitcell in the memory. Then at step 142 the margin sensor is calibrated (by means of the bitline bias circuitry 70) to have the same $T_{crit}$ as that defined by the content of the wordline registers. Thereafter the "normal" operation of the memory may begin, wherein (at step 144) the content of the wordline registers is used to generate read and write wordline pulses for accessing the memory. On an ongoing basis (at step 146) it is then determined if the voltage and temperature sensors 28 indicate a coarse change in either voltage or temperature. Whilst this is not the case then the flow simply loops back via step 144. However when such a variation is detected the flow proceeds via step 148 where the margin sensor is triggered to generate a new wordline pulse and at step 150 the wordline quantization circuitry digitises the pulse and updates the content of the wordline register, such that subsequently (at step 144) the content of the wordline register can be used to generate an updated duration of wordline pulse for accessing the memory. Note that the precision of adjusting the wordline pulse duration depends only on the margin sensor accuracy, and not that of the voltage and temperature sensors (which may have an analogue implementation and suffer from process variations). The role of the voltage and temperature sensors is only to trigger the margin sensor. Further, note that the overhead of the energy consumption of the margin sensor is only about half the energy of a single write operation to the example 78 kbit memory discussed above. Moreover, the sensor only operates when a coarse change in the voltage/temperature is sensed, which is not necessarily every cycle. The area overhead is about seven times the area of single bit-cell and can be reduced if the wordline driver and the wordline capacitor are shared between the sensor and the memory array.

Figure 12B:
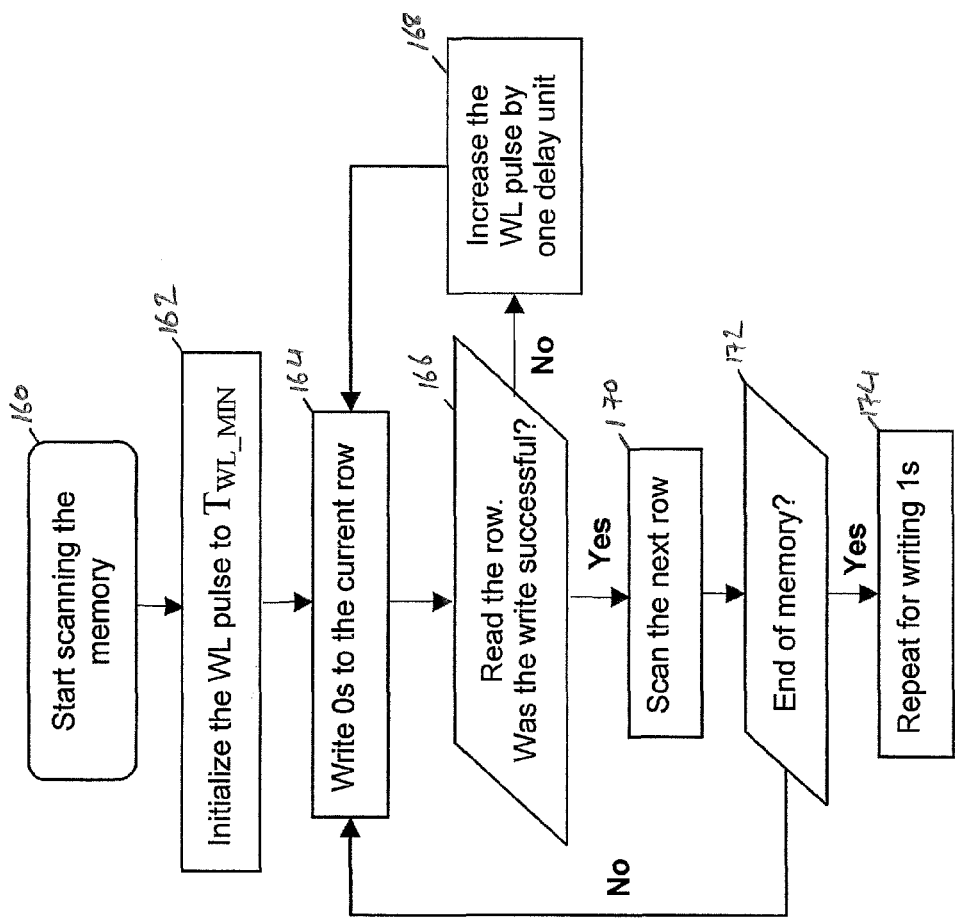
FIG. 12B schematically illustrates a series of steps which are taken in a calibration process for the sensor circuitry in one embodiment.
Figure 12A:
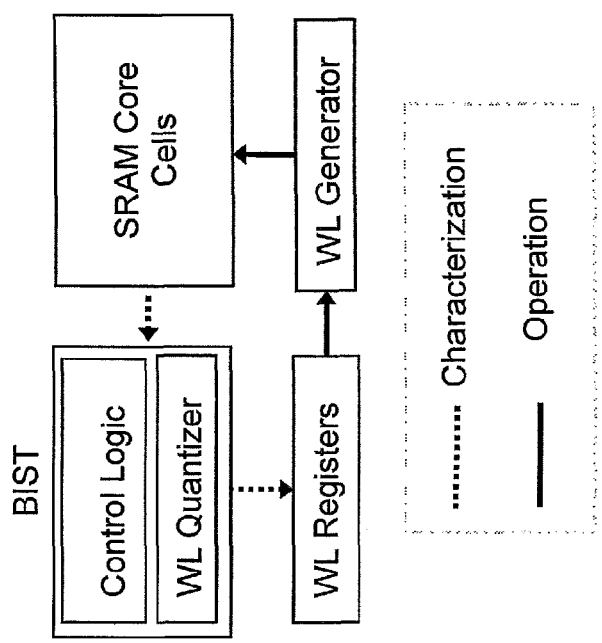
FIG. 12A schematically illustrates apparatus for storing data in one embodiment.

FIGS. 12A and 12B provide greater detail of how the BIST process is configured to determine the worst-case bitcell in the bitcell array 12, and in particular the corresponding $T_{ait}$ value for this worst-case bitcell. This is performed by means of a scanning process which begins at step 160 as illustrated in FIG. 12B. The wordline pulse is initially set to a minimum value ($T_{WL\_MIN}$), i.e. to a minimum value which can be configured by the wordline registers. An iterative process then begins at step 164 wherein firstly a full set of 0s are written to a row of the bitcell array, whereafter at step 166 the row is read back and it is determined if the write has been successful, i.e. if the full set of 0s has successfully been written and read back. If it has not then the flow proceeds via step 168 where the duration of the wordline pulse is increased by one unit, i.e. the wordline register value is increased by its least significant bit. After step 168 the write and read process to the current row is tested once more (steps 164 and 166). The flow continues in this fashion until the write is determined to have been successfully performed at step 166. The procedure then seeks to move on to the next row of the memory (at step 170), for each row of the memory to be tested in this manner until the end of the memory is reached (step 172). Once this process has been complete for the successful writing of 0s, then the procedure is repeated for testing the writing of a set of 1s to each row of the memory (step 174). Accordingly, this procedure ensures that once the full set of steps schematically illustrated in FIG. 12B are complete the content of the wordline registers defines a wordline pulse duration which corresponds to that required for the worst case bitcell in the bitcell array to be written with either a 0 or a 1.

Figures 13A, 13B:
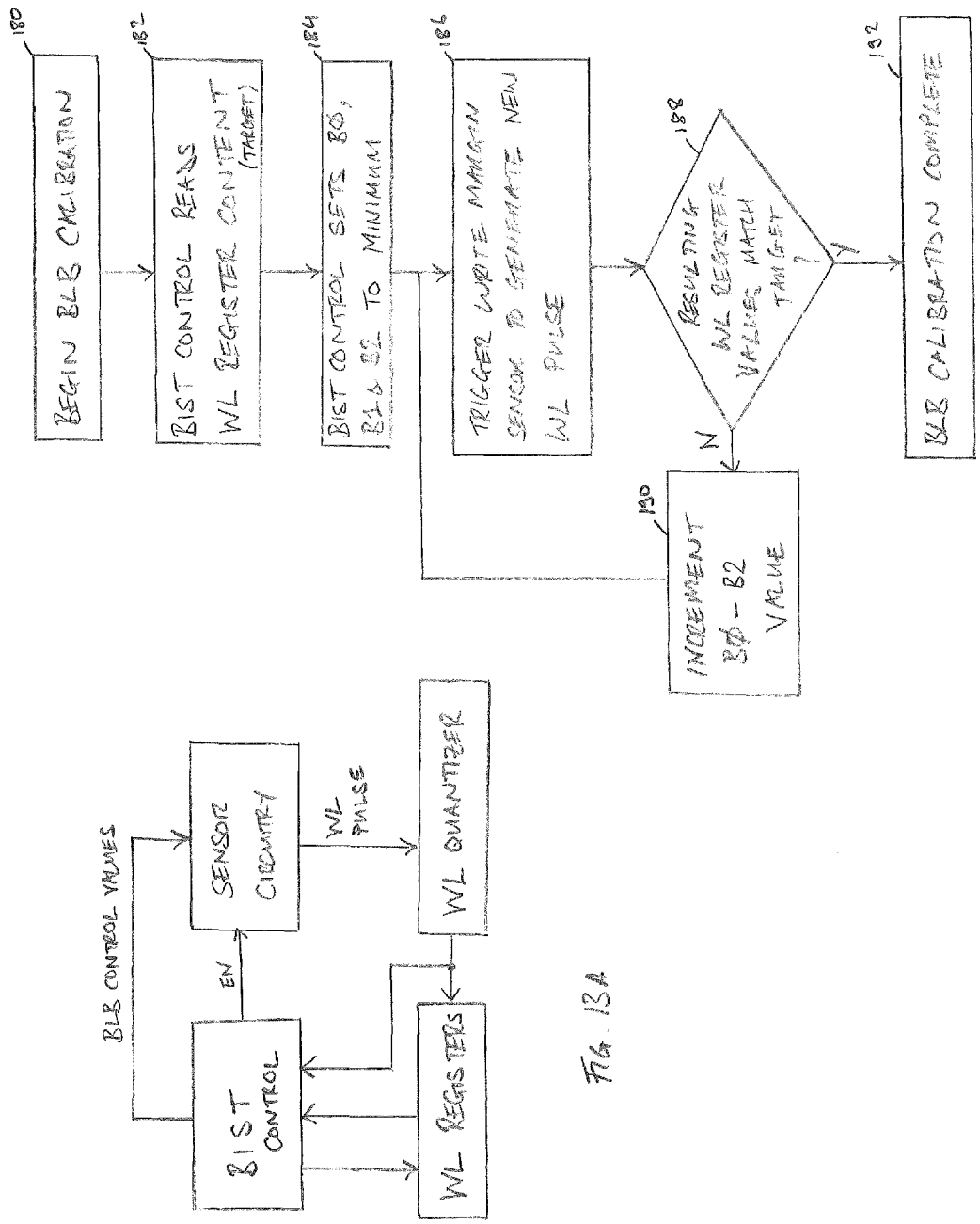
FIG. 13A schematically illustrates apparatus for storing data in one embodiment.
FIG. 13B schematically illustrates a series of steps which are taken to calibrate bitline bias circuitry in one embodiment.

FIGS. 13A and 13B schematically illustrate the procedure via which the BIST procedure calibrates the sensor circuitry using the bitline bias circuitry to cause the sensor circuitry to generate a wordline pulse having a duration corresponding to that of the worst-case bitcell in the array. The bitline bias (BLB) calibration process begins at step 180. Thereafter, at step 182 the BIST control reads the content of the wordline register and stores these values as a target value for the subsequent process. Then at step 184 the BIST control sets B0, B1 and B2 to their minimum values and then at step 186 triggers the margin sensor (sensor circuit) to generate a new wordline pulse. This wordline pulse is received by the wordline quantizer which results in new values being generated for the wordline registers. It is then determined at step 188 if these resulting wordline register values match the target values set at step 182. Whilst they do not the flow proceeds back via step 190 where the value represented by B0-B2 is incremented and (at step 186) a new wordline pulse is generated. This continues until the new wordline pulse generated by the sensor circuitry generates a wordline pulse of a duration which matches the target and then at step 192 the bitline bias calibration procedure is complete.

Although particular embodiments of the invention have been described herein, it will be apparent that the invention is not limited thereto, and that many modifications and additions may be made within the scope of the invention. For example, various combinations of the features of the following dependent claims could be made with the features of the independent claims without departing from the scope of the present invention.

We claim:

1. Apparatus for storing data, comprising:
   an array of bitcells, the array comprising a plurality of rows of bitcells, wherein access to a selected bitcell in the array of bitcells requires assertion of a wordline pulse on a wordline associated with a row in which the selected bitcell is to be found;
   wordline pulse circuitry configured to generate the wordline pulse;
   sensor circuitry comprising a calibrated bitcell and a test wordline, wherein the calibrated bitcell is calibrated in a prior calibration process to use, in writing to the calibrated bitcell, a calibrated duration of wordline pulse on the test wordline which matches a longest wordline pulse required by any bitcell in the array of bitcells for a successful write operation to be carried out,
   wherein the sensor circuitry is configured to signal a wordline pulse duration to the wordline pulse circuitry based on the calibrated duration and wherein the wordline pulse circuitry is configured to generate the wordline pulse with the wordline pulse duration signalled by the sensor circuitry,
   and wherein the sensor circuitry is configured to adapt the wordline pulse duration in dependence on current local conditions in which the apparatus operates to compensate for influence of the current local conditions on the longest wordline pulse required by any bitcell in the array of bitcells.

2. The apparatus as claimed in claim 1, wherein the sensor circuitry is configured to signal the wordline pulse duration to the wordline pulse circuitry by generating a signal wordline pulse which has the wordline pulse duration.

3. The apparatus as claimed in claim 1, wherein the sensor circuitry comprises trigger circuitry configured to activate the test wordline and the calibrated bitcell is configured such that activation of the test wordline begins a write process to invert a default value held by the calibrated bitcell,
   and the sensor circuitry comprises reset circuitry configured to deactivate the test wordline when the write process has successfully inverted the default value held by the calibrated bitcell.

4. The apparatus as claimed in claim 3, wherein the reset circuitry is configured, when deactivating the test wordline, to cause the default value to be restored to the calibrated bitcell.

5. The apparatus as claimed in claim 1, wherein the sensor circuitry comprises a capacitance coupled to the test wordline, wherein the capacitance is calibrated to correspond to a wordline capacitance of one row of the plurality of rows of bitcells.

6. The apparatus as claimed in claim 1, wherein the sensor circuitry comprises bitline bias circuitry configured to apply a bias voltage to a bitline node coupled to the calibrated bitcell, wherein calibration of the calibrated bitcell in the prior calibration process comprises setting the bias voltage to cause the calibrated duration of wordline pulse on the test wordline to match the longest wordline pulse.

7. The apparatus as claimed in claim 6, wherein the bitline bias circuitry comprises voltage divider circuitry, wherein the voltage divider circuitry comprises a plurality of voltage division paths coupled to the bitline node, and wherein each of the plurality of voltage division paths is selectively activated by a corresponding bit of a multi-bit calibration signal.

8. The apparatus as claimed in claim 7, further configured to perform an iterative calibration signal selection process to adapt the multi-bit calibration signal in the prior calibration process to cause the calibrated duration of wordline pulse on the test wordline to match the longest wordline pulse.

9. The apparatus as claimed in claim 6, wherein the sensor circuitry comprises an access transistor which is configured to couple the bitline node to the calibrated bitcell, and the array of bitcells comprises bitcell array access transistors configured to couple an array bitline to the bitcells of the array of bitcells, and the access transistor is configured to switch faster than the bitcell array access transistors in the array of bitcells.

10. The apparatus as claimed in claim 9, wherein the access transistor is sized relative to the bitcell array access transistors such that an expected distribution after manufacturing of the wordline pulse duration generated by the calibrated bitcell before the prior calibration process is carried out has a majority of data points at lower durations than data points of an expected distribution after manufacturing of the longest wordline pulse.

11. The apparatus as claimed in claim 1, wherein the sensor circuitry is configured, in response to a change in the current local conditions, to carry out a test write operation on the calibrated bitcell to determine a new wordline pulse duration.

12. The apparatus as claimed in claim 1, wherein the sensor circuitry comprises a voltage sensor configured to determine a change in a voltage supply used by the apparatus.

13. The apparatus as claimed in claim 1, wherein the sensor circuitry comprises a temperature sensor configured to determine a change in local temperature.

14. The apparatus as claimed in claim 1, further comprising self-testing circuitry configured to perform the prior calibration process comprising initially setting the wordline pulse to have a predetermined minimum duration, followed by iteratively testing each row in the array of bitcells, wherein testing each row comprises writing to that row followed by reading from that row to determine if the writing to that row was successful, and incrementing the duration of the wordline pulse until every row in the array of bitcells has been successfully written to, to thus determine the longest wordline pulse.

15. The apparatus as claimed in claim 14, wherein the self-testing circuitry is further configured to perform the prior calibration process such that testing each row comprises:
   writing a sequence of 0s to that row followed by reading from that row and determining if the writing of 0s to that row was successful; and
   writing a sequence of 1s to that row followed by reading from that row and determining if the writing of 1s to that row was successful.

16. The apparatus as claimed in claim 2, wherein the wordline pulse circuitry comprises wordline pulse quantization circuitry configured to sample the signal wordline pulse generated by the sensor circuitry and wordline pulse registers configured to store a quantization result generated by the wordline pulse quantization circuitry, wherein the wordline pulse circuitry is configured to generate the wordline pulse with a duration specified by the quantization result stored in the wordline pulse registers.

17. The apparatus as claimed in claim 16, wherein the wordline pulse quantization circuitry comprises a sequence of delay stages configured to receive the signal wordline pulse and a set of pass gates coupled to intermediate nodes between the delay stages, wherein each pass gate in the set of pass gates is configured to transmit a signal from a respective intermediate node when that pass gate is open, and the respective gates of the set of pass gates are coupled together and configured to receive the signal wordline pulse, such that the set of pass gates are opened by a starting edge of the signal wordline pulse and are closed by an ending edge of the signal wordline pulse, and comprising capture circuitry configured to capture the signals from the respective intermediate nodes via the pass gates as the quantization result.

18. The apparatus as claimed in claim 17, wherein the capture circuitry comprises thermometer to binary conversion circuitry configured to generate a set of binary values in dependence on a thermometer value represented by the signals from the respective intermediate nodes via the pass gates.

19. The apparatus as claimed in claim 17, wherein a first delay stage of the sequence of delay stages is configured to have a delay corresponding to a minimum expected wordline pulse duration for the array of bitcells.

20. The apparatus as claimed in claim 16, wherein the wordline pulse circuitry comprises binary to thermometer conversion circuitry configured to generate a set of signals in a thermometer value representation from a set of binary values given by the quantization result stored wordline pulse registers.

21. The apparatus as claimed in claim 20, wherein the wordline pulse circuitry comprises wordline pulse generation circuitry configured to generate the wordline pulse at an output node and comprising a sequence of delay stages and a set of pass gates coupled to intermediate nodes between the delay stages, wherein each pass gate in the set of pass gates is configured to be open when a respective signal from the set of signals in thermometer representation is not asserted, and respective outputs of the set of pass gates are coupled together and coupled to pulse termination circuitry, such that a starting edge received at the output node is propagated through the sequence of delay stages until the starting edge reaches an selected intermediate node coupled to an open pass gate and the starting edge activates the pulse termination circuitry to generate a ending edge at the output node.

22. The apparatus as claimed in claim 21, wherein a first delay stage of the sequence of delay stages is configured to have a delay corresponding to a minimum expected wordline pulse duration for the array of bitcells.

23. A method of adapting a duration of a wordline pulse in an apparatus for storing data comprising an array of bitcells, the array comprising a plurality of rows of bitcells, wherein access to a selected bitcell in the array of bitcells requires assertion of the wordline pulse on a wordline associated with a row in which the selected bitcell is to be found, the method comprising the steps of:

performing a prior calibration process, with respect to sensor circuitry comprising a calibrated bitcell and a test wordline, to adapt the calibrated bitcell to use, when the calibrated bitcell is written to, a calibrated duration of wordline pulse on the test wordline which matches a longest wordline pulse required by any bitcell in the array of bitcells for a successful write operation to be carried out;

signalling a wordline pulse duration based on the calibrated duration;

generating the wordline pulse with the wordline pulse duration signalled; and adapting the wordline pulse duration in dependence on current local conditions in which the apparatus operates to compensate for influence of the current local conditions on the longest wordline pulse required by any bitcell in the array of bitcells.

24. Apparatus for storing data, comprising:

an array of bitcells, the array comprising a plurality of rows of bitcells, wherein access to a selected bitcell in the array of bitcells requires assertion of the wordline pulse on a wordline associated with a row in which the selected bitcell is to be found; means for generating the wordline pulse;

means for performing a prior calibration process, with respect to sensor circuitry comprising a calibrated bitcell and a test wordline, to adapt the calibrated bitcell to use, when the calibrated bitcell is written to, a calibrated duration of wordline pulse on the test wordline which matches a longest wordline pulse required by any bitcell in the array of bitcells for a successful write operation to be carried out;

means for signalling a wordline pulse duration based on the calibrated duration to the means for generating the wordline pulse;

means for adapting the wordline pulse duration in dependence on current local conditions in which the apparatus operates to compensate for influence of the current local conditions on the longest wordline pulse required by any bitcell in the array of bitcells.

\* \* \* \* \*